(12) United States Patent
Lo et al.

(10) Patent No.: US 9,697,410 B2
(45) Date of Patent: Jul. 4, 2017

(54) CAPACITIVE FINGERPRINT SENSOR

(71) Applicant: Contek Life Science Co., Ltd., Taipei (TW)

(72) Inventors: Yen Ju Lo, Taipei (TW); Chein-Hsun Wang, Hsin-Chu (TW); Dai-Chi Wu, Taipei (TW)

(73) Assignee: CONTEK LIFE SCIENCE CO., LTD., Taipei (TW)

( * ) Notice: Subject to any disclaimer, the term of this patent is extended or adjusted under 35 U.S.C. 154(b) by 0 days.

(21) Appl. No.: 15/051,460

(22) Filed: Feb. 23, 2016

(65) Prior Publication Data

US 2017/0161539 A1  Jun. 8, 2017

(30) Foreign Application Priority Data

Dec. 8, 2015  (CN) .......................... 2015 1 0895291

(51) Int. Cl.
*G06K 9/20* (2006.01)
*G06K 9/36* (2006.01)
*G06K 9/00* (2006.01)

(52) U.S. Cl.
CPC ......... *G06K 9/0002* (2013.01); *G06K 9/0008* (2013.01); *G06K 9/00053* (2013.01)

(58) Field of Classification Search
CPC ..... G06K 9/00013–2009/0006; H04N 5/3658; G06F 3/044
See application file for complete search history.

(56) References Cited

U.S. PATENT DOCUMENTS

| 2005/0024065 A1* | 2/2005 | Umeda | G06K 9/0002 324/663 |
| 2010/0055838 A1* | 3/2010 | Misra | G06K 9/0002 438/107 |
| 2013/0315451 A1* | 11/2013 | Franza | G06K 9/0002 382/124 |

\* cited by examiner

*Primary Examiner* — Brian P Werner
(74) *Attorney, Agent, or Firm* — Muncy, Geissler, Olds & Lowe, P.C.

(57) ABSTRACT

A capacitive fingerprint sensor includes a compensation memory which stores a direct current offset parameter and a gain compensation parameter of each sensing unit of a capacitive sensing array. Therefore, the above-mentioned capacitive fingerprint sensor is able to individually compensate sensing signals measured by each the sensing unit and the sensing signals measured by each sensing unit have better uniformity and signal to noise ratio (SNR).

15 Claims, 5 Drawing Sheets

CAPACITIVE FINGERPRINT SENSOR

BACKGROUND OF THE INVENTION

1. Field of the Invention

The present invention relates to a fingerprint sensor, and more particularly to a capacitive fingerprint sensor.

2. Description of the Prior Art

The principle of capacitive fingerprint sensor is to detect a capacitance variation between ridges and valleys of human finger. Normal depth of the valley is around 20-35 μm with air filled which has dielectric constant of 1. The dielectric constant of human tissue is about 4-8. Therefore, minute capacitance variation can be detected by the capacitive fingerprint sensor.

Referring to FIG. 1 to illustrate a detection method of a capacitive fingerprint sensor based on charge sharing algorithm. The capacitive fingerprint sensor includes a plurality of sensing units SU arranged in an array. The ridge and valley of the fingerprint FP has a capacitor C3 when the fingerprint FP touches the capacitive fingerprint sensor. Packaging the capacitive fingerprint sensor will form a dielectric layer OL, such as an oxide layer or epoxy etc., which has a capacitor C2. The capacitor C2 and the capacitor C3 connected in series has a capacitance value Cs which can be calculated by the following formula:

$$1/Cs=1/C2+1/C3,$$

wherein C2 and C3 respectively represents the capacitance value of the capacitor C2 and the capacitor C3.

Measuring variation of the capacitance value Cs can be implemented by the following steps. First, the switch S1 is turned on and the switch S2 is turned off to precharge the capacitor C0 to bias voltage Va. Then the switch S1 is turned off and the switch S2 is turned on so that the charge on the capacitor C0 will redistribute to give a bias voltage V1 which can be calculated by the following formula:

$$V1=Va*C0/(C0+C1+Cs),$$

wherein C0 and C1 respectively represents the capacitance value of the capacitor C0 and the capacitor C1. The capacitor C1 is parasitic stray capacitance of a circuit. The bias voltage V1 of sensing node of the sensing unit SU11 is buffered by buffer amplifier BA, and its output is bias voltage V2 which can be calculated by the following formula:

$$V2=g*V1$$

wherein g is the gain of the buffer amplifier BA. Each sensing unit SU has one buffer amplifier BA, and the output of the buffer amplifier BA is multiplexed by row switch Sr1 and column switch Sc1-Sc3 before feed to sampling capacitor Csh. For example, the output of the sensing unit SU11 is controlled by the row switch Sr1 and column switch Sc1; the output of the sensing unit SU12 is controlled by the row switch Sr1 and column switch Sc2; and the output of the sensing unit SU13 is controlled by the row switch Sr1 and column switch Sc3. Finally, the analog to digital converter ADC converts the bias voltage V3 of the sampling capacitor Csh to a digital format. The buffer amplifier has gain variation from sensing unit to sensing unit caused by the process or other factors. In addition, due to the impact of the parasitic stray capacitance C1 and the capacitor C2, the uniformity of the bias voltage outputted from each sensing unit is poorer which impacts subsequent signal processing, such as direct current (DC) subtraction.

Besides, referring to FIG. 2 which shows a cross-sectional view of conventional package of the capacitive fingerprint sensor. A capacitive sensor chip 120 is attached to a substrate 110. Gold wires 130 are used to make connection between bonding pads 121 of the capacitive fingerprint chip 120 and a lead frame 111 on substrate 110. After chip attachment and wire bonding, the whole chip is molded with a high dielectric filler 140. However, during molding process, the difference of thermal expansion coefficient between the capacitive fingerprint chip 120 and the filler 140 will cause die mark or, as the height difference H shown in FIG. 2. Therefore, if the capacitive fingerprint sensor with warpage is disposed under a protective glass, an air layer or an adhesive gel is formed between the capacitive fingerprint sensor and the protective glass, which decreases the strength of the sensing signal and deteriorates the uniformity between the sensing units.

Accordingly, it is highly desirable to make the sensing signals outputted from each sensing unit have better uniformity.

SUMMARY OF THE INVENTION

The present invention is directed to a capacitive fingerprint sensor which stores a direct current offset parameter and a gain compensation parameter of each sensing unit to compensate sensing signals measured by each sensing unit, so that the sensing signals outputted from each sensing unit have better uniformity.

In one embodiment, the proposed capacitive fingerprint sensor includes a capacitive sensing array, a row decoder, a column decoder, a compensation memory, a controller, a digital to analog converter and a compensation circuit. The capacitive sensing array comprises a plurality of sensing units arranged in an array, wherein the capacitive sensing array individually outputs sensing signals measured by each the sensing unit. The row decoder and the column decoder is electrically connected with the capacitive sensing array to address each the sensing unit. The compensation memory stores a direct current (DC) offset parameter and a gain compensation parameter of each the sensing unit. The controller is electrically connected with the row decoder, the column decoder and the compensation memory. The controller controls the capacitive sensing array to individually output the sensing signals measured by each the sensing unit and controls the compensation memory to output the direct current offset parameter and the gain compensation parameter corresponding to the sensing unit. The digital to analog converter is electrically connected with the compensation memory and outputs a direct current offset compensation signal according to the direct current offset parameter. The compensation circuit is electrically connected with the capacitive sensing array, the compensation memory and the digital to analog converter and individually compensates the sensing signals measured by each the sensing unit to output compensated sensing signals according to the direct current offset compensation signal and the gain compensation parameter. The compensation memory comprises an external memory and a register. The external memory is electrically connected with the controller and stores the direct current offset parameter and the gain compensation parameter of each the sensing unit. The register is electrically connected with the controller, the digital to analog converter and the compensation circuit and stores the direct current offset parameter and the gain compensation parameter of part of the sensing units, wherein the external memory and the register are arranged on the different dies.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENT

Various embodiments of the present invention will be described in detail below and illustrated in conjunction with the accompanying drawings. In addition to these detailed descriptions, the present invention can be widely implemented in other embodiments, and apparent alternations, modifications and equivalent changes of any mentioned embodiments are all included within the scope of the present invention and based on the scope of the Claims. In the descriptions of the specification, in order to make readers have a more complete understanding about the present invention, many specific details are provided; however, the present invention may be implemented without parts of or all the specific details. In addition, the well-known steps or elements are not described in detail, in order to avoid unnecessary limitations to the present invention. Same or similar elements in Figures will be indicated by same or similar reference numbers. It is noted that the Figures are schematic and may not represent the actual size or number of the elements. For clearness of the Figures, some details may not be fully depicted.

Figure 1:
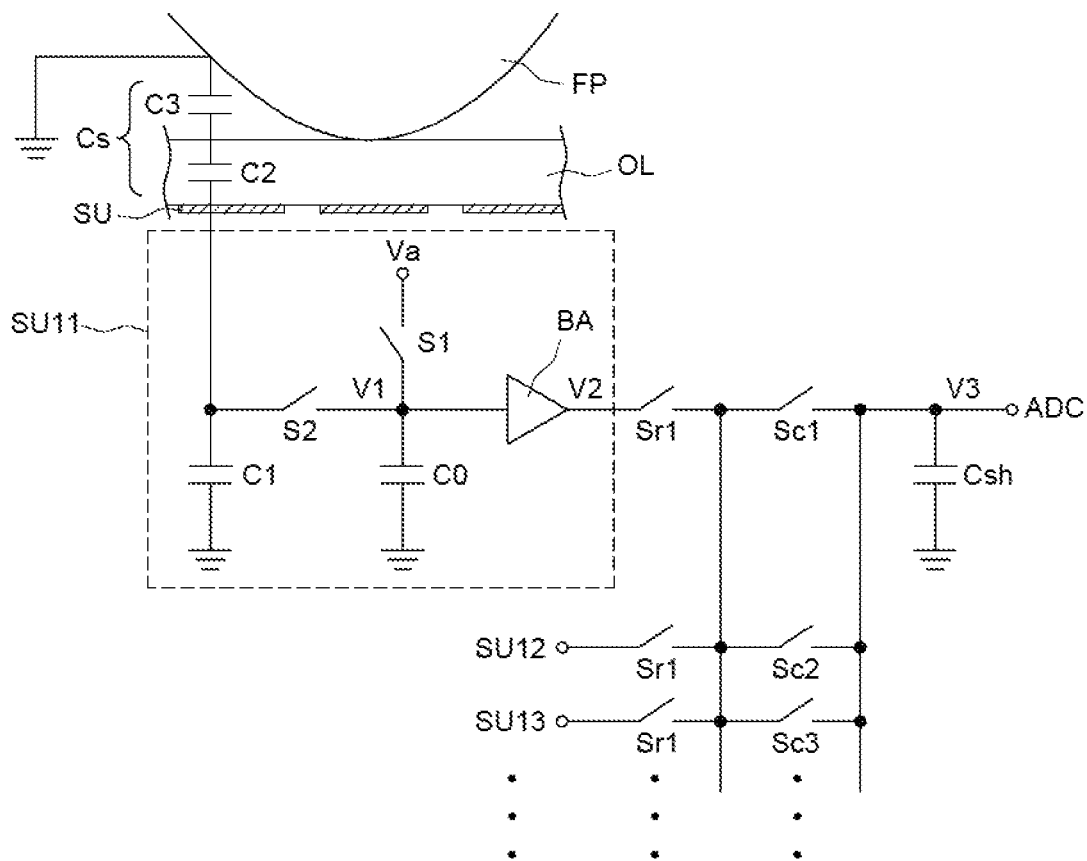
FIG. 1 is a diagram schematically illustrating a part of circuit of a capacitive fingerprint sensor according to a prior art.
Figure 2:
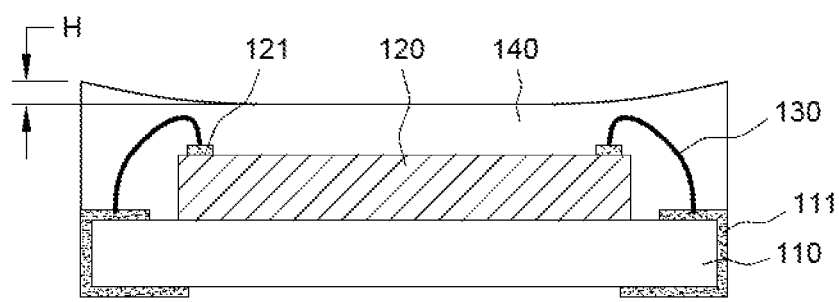
FIG. 2 is a diagram schematically illustrating a package structure of a capacitive fingerprint sensor according to a prior art.
Figure 3:
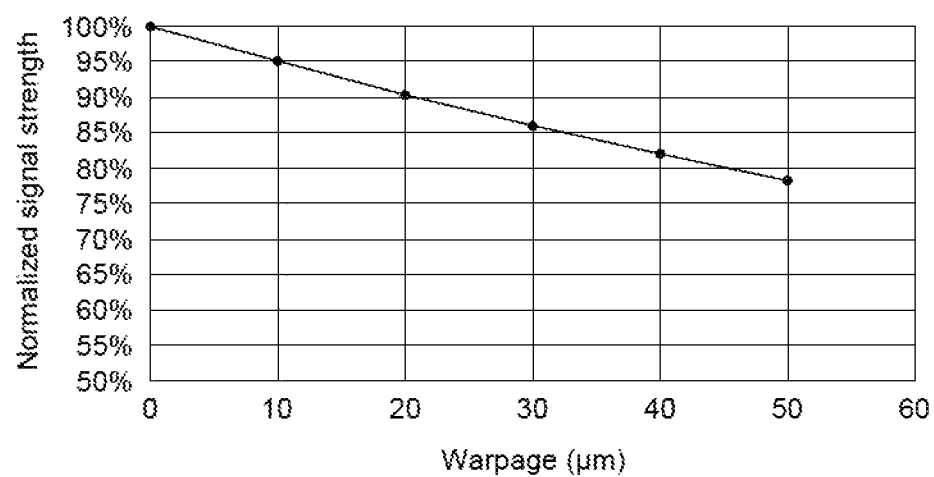
FIG. 3 is a graph schematically illustrating the relationship between the package warpage and the signal strength of a capacitive fingerprint sensor.

Referring to FIG. 3 which illustrates a relationship between the warpage and the signal strength of a capacitive fingerprint sensor arranged under a 200 μm glass. As shown in FIG. 3, it will result in the loss of more than 20% of the signal strength when the extent of chip warpage exceeds 50 μm, and general warpage can be between 50-100 μm. It should be noted that the normalized signal variation from valley to ridge is only 16%. Therefore, the chip warpage after packaging not only decreases the uniformity of bias voltage outputted from each sensing unit, but also deteriorates the signal to noise ratio (SNR). A capacitive fingerprint sensor of the present invention compensates sensing signals measured by each sensing unit to output compensated sensing signals with better uniformity.

Figure 4:
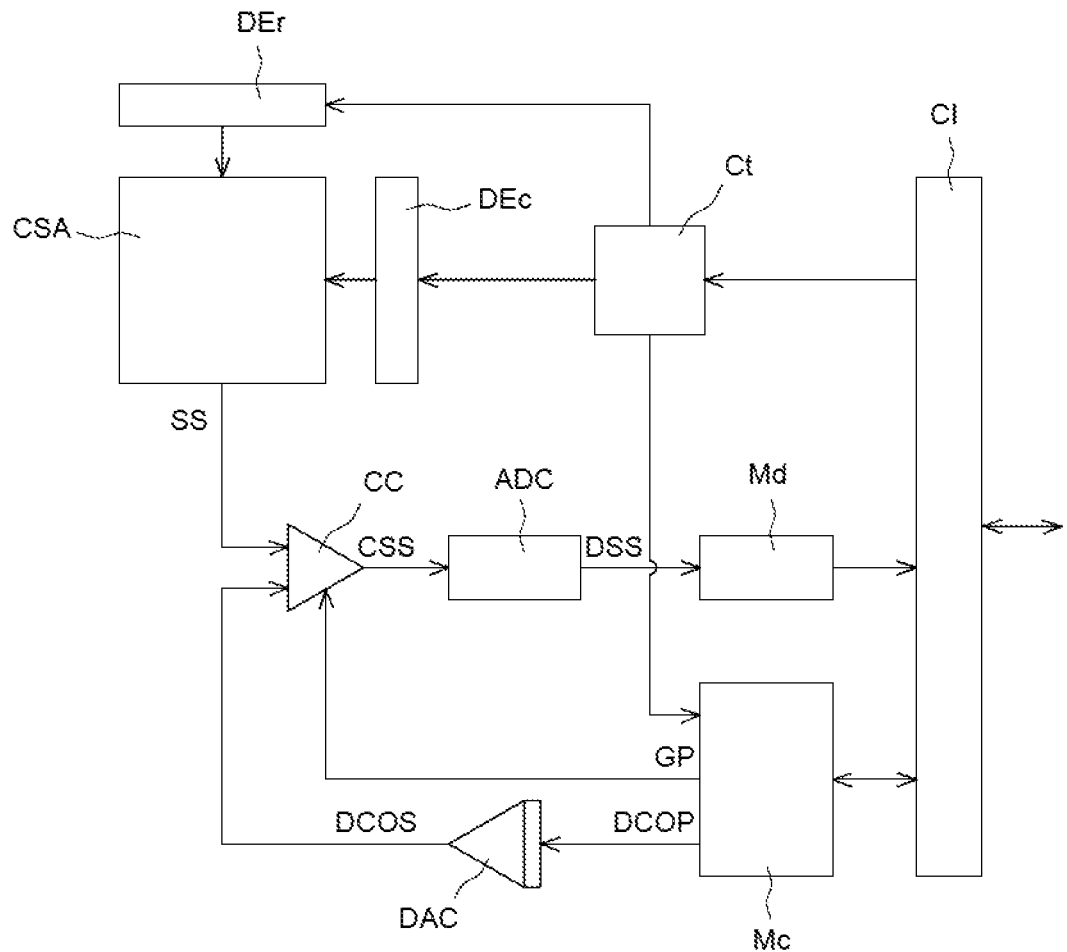
FIG. 4 is a block diagram schematically illustrating a capacitive fingerprint sensor according to an embodiment of the present invention.

Referring to FIG. 4, a capacitive fingerprint sensor according to an embodiment of the present invention comprises a capacitive sensing array CSA, a compensation memory Mc, a digital to analog converter DAC and a compensation circuit CC. The capacitive sensing array CSA comprises a plurality of sensing units arranged in an array and individually outputs sensing signals SS measured by each the sensing unit. For example, the capacitive fingerprint sensor further comprises a row decoder DEr, a column decoder DEc and a controller Ct. The row decoder DEr and the column decoder DEc are electrically connected with the capacitive sensing array CSA and addresses each sensing unit of the capacitive sensing array CSA. The controller Ct is electrically connected with the row decoder DEr, the column decoder DEc and controls the capacitive sensing array CSA through the row decoder DEr and the column decoder DEc to individually output sensing signals SS measured by each sensing unit.

The compensation memory Mc stores a direct current offset parameter DCOP and a gain compensation parameter GP of each sensing unit in the capacitive sensing array CSA. For example, after packaging the capacitive fingerprint sensor or assembling the capacitive fingerprint sensor in an electronic device, the direct current offset parameter DCOP and the gain compensation parameter GP of each sensing unit can be obtained by a calibrating process and stored in the compensation memory Mc. The digital to analog converter DAC is electrically connected with the compensation memory Mc. The digital to analog converter DAC can output a direct current offset compensation signal DCOS according to the direct current offset parameter DCOP.

The compensation circuit CC is electrically connected with the capacitive sensing array CSA, the compensation memory Mc and the digital to analog converter DAC. The compensation circuit CC can individually compensate the sensing signals SS measured by each sensing unit according to the direct current offset compensation signal DCOS and the gain compensation parameter GP, and output compensated sensing signals CSS. For example, the controller Ct is also electrically connected with the compensation memory Mc, so that the controller Ct can control the capacitive sensing array CSA through the row decoder DEr and the column decoder DEc to individually output the sensing signals SS measured by each sensing unit and control the compensation memory Mc to output the direct current offset parameter DCOP and the gain compensation parameter GP corresponding to the sensing unit at the same time, and then the compensation circuit CC outputs the compensated sensing signals CSS. Accordingly, the compensated sensing signals CSS with better uniformity and better SNR are obtained. In other words, in the case of farther distance from the fingerprint, such as arranged a thicker protective glass between the capacitive sensing array and the fingerprint, the capacitive fingerprint sensor of the present invention can still effectively detect a capacitance variation from valley to ridge of fingerprint. It should be understood that the sensing efficiency can be enhanced by arranging the compensation memory and other elements of the capacitive fingerprint sensor on a single die, but is not limited thereto. The compensation memory and other elements of the capacitive fingerprint sensor can also be provided separately. For example, the memory of an electronic device can be as the compensation memory for storing the direct current offset parameter DCOP and the gain compensation parameter GP.

In one embodiment, the capacitive fingerprint sensor further comprises an analog to digital converter ADC and a data memory Md. The analog to digital converter ADC is electrically connected with the compensation circuit CC for receiving the compensated sensing signals CSS from the compensation circuit CC and converting the compensated sensing signal CSS to a digital sensing signal DSS. The data memory Md is electrically connected with the analog to digital converter ADC for storing the digital sensing signal DSS outputted by the analog to digital converter ADC. In one embodiment, the data memory Md may be a first-in-first-out (FIFO) type memory.

In one embodiment, the capacitive fingerprint sensor further comprises a communication interface CI electrically connected with the compensation memory Mc, the controller Ct and the data memory Md. The capacitive fingerprint sensor is electrically connected with the external circuit through the communication interface CI, so that the external circuit is able to control the capacitive fingerprint sensor and access the compensation memory Mc and/or the data memory Md, for example, writing the direct current offset parameter DCOP and the gain compensation parameter GP of each sensing unit in the compensation memory Mc or reading the sensing result of fingerprint from the data memory Md. In one embodiment, the communication interface CI may be a serial peripheral interface (SPI), a parallel interface, a universal serial bus (USB) or an inter-integrated circuit bus ($I^2C$).

Figure 5:
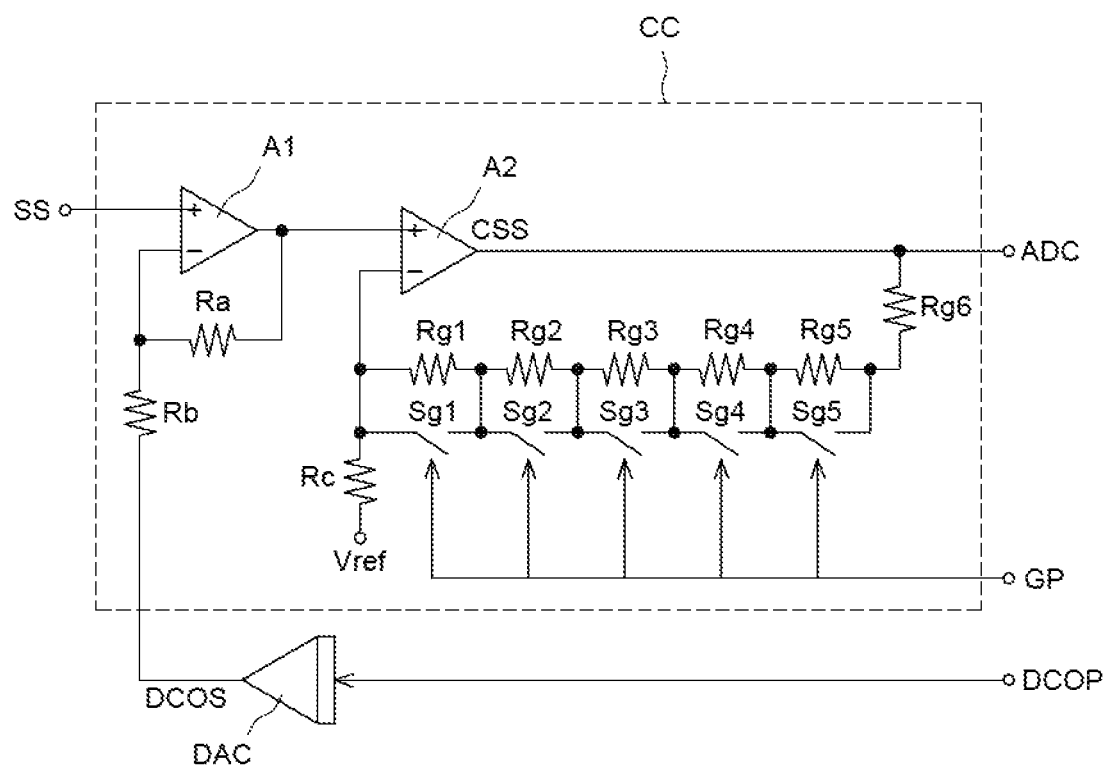
FIG. 5 is a circuit diagram schematically illustrating a compensation circuit of a capacitive fingerprint sensor according to an embodiment of the present invention.

In one embodiment, the compensation circuit CC may be a programmable gain amplifier (PGA). It can be understood that the programmable gain amplifier may be a single-stage or multi-stage amplifier. For example, referring to FIG. 5 illustrating a compensation circuit CC in a structure of multi-stage amplifier. The compensation circuit CC shown in FIG. 5 comprises a first stage amplifier A1 and a second stage amplifier A2. The first stage amplifier A1 has a fixed gain which is defined by the resistance ratio (1+Ra/Rb) of the resistor Ra and the resistor Rb. The positive input terminal of the first stage amplifier A1 receives the sensing signal SS outputted by the capacitive sensing array CSA and the negative input terminal of the first stage amplifier A1 receives the direct current offset compensation signal DCOS based on the direct current offset parameter DCOP of each sensing unit. Thus, the first stage amplifier A1 is able to process the sensing signal SS by DC subtraction. Accordingly, the sensing signal SS subtracted the direct current offset compensation signal DCOS can be processed by the direct current amplification once again with greater magnification.

Continuing the above description, the positive input terminal of the second stage amplifier A2 is electrically connected with the output terminal of the first stage amplifier A1 and the negative input terminal of the second stage amplifier A2 is connected with a fixed bias voltage Vref. The gain of the second stage amplifier A2 is controlled by the resistors Rg1-Rg6 and Rc and the switches Sg1-Sg5. The gain of the second stage amplifier A2 can be defined by the switches Sg1-Sg5 which is controlled by the gain compensation parameter GP. In one embodiment, the switches Sg1-Sg5 can be implemented by metal oxide semiconductor field effect transistor (MOSFET). For example, the switches Sg1-Sg5 determines the feedback equivalent resistance, and then the gain of the second stage amplifier A2 is 1+Rgi/Rc. Therefore, the second stage amplifier A2 can compensate the gain of the sensing signal SS outputted by each corresponding sensing unit based on the gain compensation parameter GP. After respectively compensating the DC subtraction and the gain, the compensated sensing signal CSS with better uniformity can be obtained.

In one embodiment, the compensation memory Mc may be a random access memory or a non-volatile memory, such as flip-flop, one-time programmable (OTP) memory, multiple times programmable (MTP) memory, electrically-erasable programmable read-only memory (EEPROM) or flash memory. In one embodiment, the direct current offset parameter DCOP comprises a global direct current offset and an individual direct current offset corresponding to each sensing unit. For example, the global direct current offset can be a fixed value so as to decrease the storage space of the memory. It can be understood that the direct current offset parameter DCOP may be a global direct current offset and an individual direct current offset dependent on a geometry position of each sensing unit when the non-uniformity of the sensing signals between the sensing units is associated with the geometry of chip warpage. For example, the individual direct current offset of each sensing unit can be presented by a correction function associated with the geometry of the chip warpage. Similarly, the gain compensation parameter GP comprises a global gain compensation and an individual gain compensation corresponding to each the sensing unit, or the gain compensation parameter GP comprises a global gain compensation and an individual gain compensation dependent on a geometry position of each the sensing unit for decreasing the storage space of the memory.

In one embodiment, the elements shown in FIG. 4 can be designed in a single die, but is not limited thereto. In one embodiment, referring to FIG. 6, the function of the compensation memory Mc shown in FIG. 4 can be implemented by an external memory Me and a register Reg. The external memory Me and the register Reg are respectively connected with the controller Ct, wherein the external memory Me stores the direct current offset parameter DCOP and the gain compensation parameter GP of each sensing unit of the capacitive sensing array CSA and the register Reg only stores the direct current offset parameter DCOP and the gain compensation parameter GP of part of the sensing units. According to this structure, the controller Ct can control the capacitive sensing array CSA to individually output sensing signals SS, read the direct current offset parameter DCOP and the gain compensation parameter GP of corresponding sensing unit from the external memory Me and store the direct current offset parameter DCOP and the gain compensation parameter GP in the register Reg, so that the digital to analog converter DAC and the compensation circuit CC can read the direct current offset parameter DCOP and the gain compensation parameter GP of corresponding sensing unit from the register Reg to compensate the sensing signals measured by each sensing unit. It can be understood that the register Reg only stores a small amount of the direct current offset parameter DCOP and the gain compensation parameter GP, thus occupied area of register Reg in a die is smaller. In one embodiment, the external memory Me may be a non-volatile memory, such as OTP memory, MTP memory, EEPROM or flash memory; the register Reg may be a random access memory.

Figure 6:
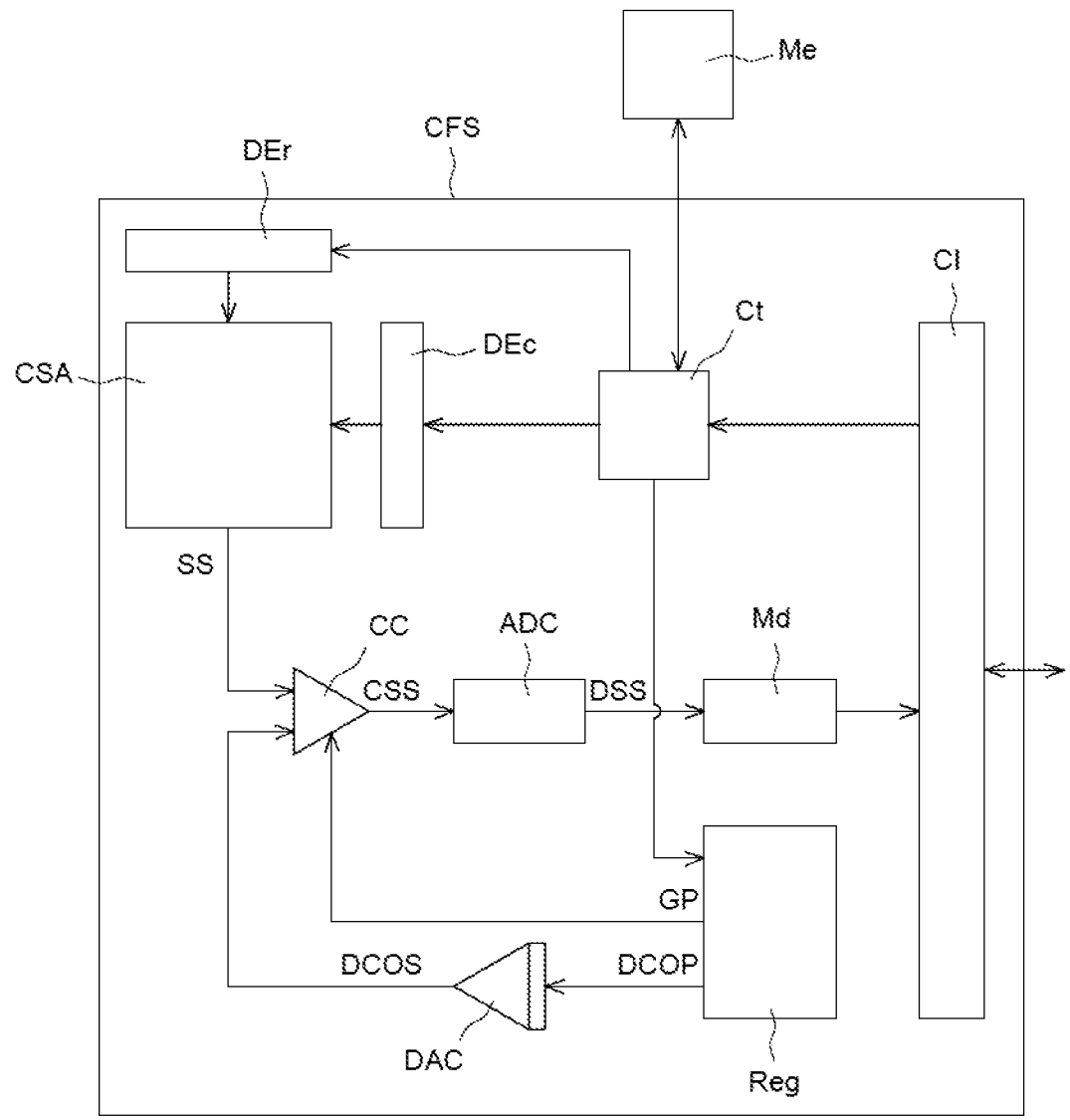
FIG. 6 is a block diagram schematically illustrating a capacitive fingerprint sensor according to another embodiment of the present invention.

It can be understood that the elements of the capacitive fingerprint sensor CFS shown in FIG. 6 can be designed on a single die and the external memory Me is arranged on another die. And then the external memory Me is electrically connected with the controller Ct of the capacitive fingerprint sensor CFS by an appropriate way. For example, the capacitive fingerprint sensor CFS and the external memory Me can be packaged in a single package by multi-chip package (MCP) and make the external memory Me be electrically connected with the controller Ct. Alternatively, the circuit board or cable for electrically connecting the capacitive fingerprint sensor CFS to the external circuit comprises contact pads corresponding to the communication interface CI and other contact pads electrically connected with the controller Ct, and the external memory Me can be arranged on the contact pads electrically connected with the controller Ct by surface-mount technology (SMT) so that the external memory Me can be electrically connected with the controller Ct of the capacitive fingerprint sensor CFS and a capacitive fingerprint sensor module is formed.

To summarize the foregoing descriptions, the capacitive fingerprint sensor of the present invention comprises a compensation memory which stores a direct current offset parameter and a gain compensation parameter of each sensing unit. Therefore, the capacitive fingerprint sensor of the present invention is able to individually compensate the sensing signals measured by each sensing unit. Accordingly, the sensing signals outputted by each sensing unit have better uniformity and SNR. In other words, in the case of farther distance between the capacitive sensing array and the fingerprint, such as arranged a thicker protective glass, the capacitive fingerprint sensor of the present invention can still effectively detect the capacitance variation from valley to ridge of fingerprint and identifies the fingerprint.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the scope of the appended claims.

What is claimed is:

1. A capacitive fingerprint sensor comprising:
   a capacitive sensing array comprising a plurality of sensing units arranged in an array, wherein the capacitive sensing array individually outputs sensing signals measured by each the sensing unit;
   a row decoder and a column decoder electrically connected with the capacitive sensing array to address each the sensing unit;
   a compensation memory storing a direct current offset parameter and a gain compensation parameter of each the sensing unit;
   a controller electrically connected with the row decoder, the column decoder and the compensation memory, wherein the controller controls the capacitive sensing array to individually output the sensing signals measured by each the sensing unit and controls the compensation memory to output the direct current offset parameter and the gain compensation parameter corresponding to the sensing unit;
   a digital to analog converter electrically connected with the compensation memory and outputting a direct current offset compensation signal according to the direct current offset parameter; and
   a compensation circuit electrically connected with the capacitive sensing array, the compensation memory and the digital to analog converter and individually compensating the sensing signals measured by each the sensing unit to output compensated sensing signals according to the direct current offset compensation signal and the gain compensation parameter;
   wherein the compensation memory comprising:
   an external memory electrically connected with the controller and storing the direct current offset parameter and the gain compensation parameter of each the sensing unit; and
   a register electrically connected with the controller, the digital to analog converter and the compensation circuit and storing the direct current offset parameter and the gain compensation parameter of part of the sensing units, wherein the external memory and the register are arranged on the different dies.

2. The capacitive fingerprint sensor according to claim 1, wherein the external memory comprises a non-volatile memory and the register comprises a random access memory.

3. The capacitive fingerprint sensor according to claim 1, wherein the compensation memory, the capacitive sensing array, the digital to analog converter and the compensation circuit are arranged on a single die.

4. The capacitive fingerprint sensor according to claim 1, further comprising:
   an analog to digital converter electrically connected with the compensation circuit and converting the compensated sensing signal to a digital sensing signal; and
   a data memory electrically connected with the analog to digital converter and storing the digital sensing signal.

5. The capacitive fingerprint sensor according to claim 4, wherein the data memory comprises a first-in-first-out type memory.

6. The capacitive fingerprint sensor according to claim 1, further comprising:
   a communication interface electrically connected with the compensation memory to access the compensation memory.

7. The capacitive fingerprint sensor according to claim 6, wherein the communication interface comprises a serial peripheral interface, a parallel interface, a universal serial bus or an inter-integrated circuit bus.

8. The capacitive fingerprint sensor according to claim 1, wherein the compensation circuit comprises a programmable gain amplifier.

9. The capacitive fingerprint sensor according to claim 8, wherein the programmable gain amplifier is a single-stage or multi-stage amplifier.

10. The capacitive fingerprint sensor according to claim 1, wherein the compensation memory comprises a random access memory or a non-volatile memory.

11. The capacitive fingerprint sensor according to claim 1, wherein the compensation memory comprises a flip-flop, a one-time programmable memory, a multiple times programmable memory, an electrically-erasable programmable read-only memory or a flash memory.

12. The capacitive fingerprint sensor according to claim 1, wherein the direct current offset parameter comprises a global direct current offset and an individual direct current offset corresponding to each the sensing unit.

13. The capacitive fingerprint sensor according to claim 1, wherein the direct current offset parameter comprises a global direct current offset and an individual direct current offset dependent on a geometry position of each the sensing unit.

14. The capacitive fingerprint sensor according to claim 1, wherein the gain compensation parameter comprises a global gain compensation and an individual gain compensation corresponding to each the sensing unit.

15. The capacitive fingerprint sensor according to claim 1, wherein the gain compensation parameter comprises a global gain compensation and an individual gain compensation dependent on a geometry position of each the sensing unit.

* * * * *